United States Patent [19]

Hutt et al.

[11] 3,961,137

[45] June 1, 1976

[54] BIPHASE DIGITAL TELEVISION SYSTEMS

[75] Inventors: Peter Richard Hutt, Richmond; Alan Ronald Blake, London; Gunter von Cavallar, South Wonston, near Winchester; Brian Neil Douglas, London; Philip John Dodds, Southampton, all of England

[73] Assignee: Independent Broadcasting Authority, London, England

[22] Filed: July 30, 1974

[21] Appl. No.: 493,111

[30] Foreign Application Priority Data

July 30, 1973   United Kingdom............... 36205/73

[52] U.S. Cl.............................. 178/68; 178/69.5 R; 178/69.5 TV; 178/6
[51] Int. Cl.²..................... H04L 7/08; H04L 17/02; H04N 7/00
[58] Field of Search................... 178/68, 67, 69.5 R, 178/69.5 F, 69.5 TV, DIG. 23, 5.6, 66 R, DIG. 22, 6, 69.5 G; 325/38 A, 38 R, 30, 39, 141, 164; 307/269; 328/63, 134; 179/15 BS; 340/347 DD; 360/40

[56] References Cited

UNITED STATES PATENTS

| | | | |
|---|---|---|---|
| 2,700,155 | 1/1955 | Clayden...................... | 340/347 DD |
| 3,156,893 | 11/1964 | Harel.............................. | 178/67 |
| 3,419,804 | 12/1968 | Gorog et al............................. | 178/68 |
| 3,458,835 | 7/1969 | Saeger........................... | 178/69.5 F |
| 3,479,451 | 11/1969 | Regunberg........................... | 178/5.6 |
| 3,491,199 | 1/1970 | Weinstein et al..................... | 178/5.6 |
| 3,509,277 | 4/1970 | Moore et al........................... | 178/68 |
| 3,514,706 | 5/1970 | Dupraz..................... | 178/68 |
| 3,576,391 | 4/1971 | Houghton............................. | 178/5.6 |
| 3,726,992 | 4/1973 | Eguichi et al........................ | 178/5.6 |

*Primary Examiner*—George H. Libman
*Assistant Examiner*—John C. Martin
*Attorney, Agent, or Firm*—A. W. Breiner

[57] ABSTRACT

Apparatus for processing groups of digital data for transmission comprises a run-in signal generator for providing at the output of the apparatus an output in which the groups of data are each preceded by a run-in signal, said apparatus being so constituted that the output is in the form of digital signals of the complemented type, and a start code generator operable to provide a start code with at least one break of complementation and arranged to insert a start code between each group and its preceding run-in signal.

The apparatus is especially suitable for the transmission of data intermittently, e.g. during periods of a television signal unoccupied by wide-band picture signals. Because of the complementation break, the start code cannot arise from a data combination. Good reliability of reception is achieved on channels susceptible to interference.

An apparatus for reception comprises a memory device controlled by a clock circuit responsive to the run-in signal, and means responsive to the start code to route the data for display purposes.

1 Claim, 7 Drawing Figures

BIPHASE DIGITAL TELEVISION SYSTEMS

The present invention relates to television systems and has as an object the provision of television systems for the presentation of visual displays in a novel and convenient manner.

In any normal television system, the transmission of the wide band video signals which are to produce the actual picture elements on the screen of the receiver, is interrupted between the scanning periods for line and field synchronisation purposes. Consequently there are periods during which no video signals are being transmitted. It is now possible to use these periods for the transmission of data which is not necessarily concerned with the video transmission itself.

Basically, data representable by standard graphical symbols such as alpha-numeric symbols can be transmitted via a restricted channel provided that the rate of transmission is restricted. It is now possible to use periods as aforesaid especially the line times of the field blanking intervals (i.e. the times of the individual lines occurring between fields which correspond with the times occupied by video signals on active picture lines), hereinafter "LTFB," for the transmission of pages of data. Typically, using 8-bit digital signals representing alpha-numeric characters at a bit rate of 2.5 M bit per second, 50 pages of data each consisting of 22 strips of 40 characters can be transmitted repeatedly in a total cycle time of 90 seconds using only a single line of the field blanking period per field of the 625 line system as operated in the United Kingdom.

Objects of the present invention are to provide apparatus for and a method of processing groups of digital data to provide signals especially suitable for the foregoing purpose or other purposes in which the groups are transmitted on a channel which is shared or susceptible to interference. Another object is to provide apparatus for the reception of such signals.

In accordance with the present invention, there is provided apparatus for processing groups of digital data for transmission, which comprises a run-in signal generator for providing at the output of the apparatus an output in which the groups of data are each preceded by a run-in signal, said apparatus being so constituted that the output is in the form of digital signals of the bi-phase type, and a start code generator operable to provide a start code with at least one break of complementation and arranged to insert the start code between each group and its preceding run-in signal.

Also in accordance with the present invention there is provided a method of generating digital signals for transmission during periods of a television signal which are unoccupied by video signals which comprises reading out digital data in the form of groups for transmission during said periods, adding a run-in signal to each group before the commencement thereof, a digital start code with at least one break of complementation being positioned, in time, between each group and its run-in signal and at any time converting the digital data, and if necessary the run-in signal to digital signals of the complemented type.

Further in accordance with the present invention there is provided apparatus for the reception of signals of the kind aforesaid which comprises a clock circuit responsive for synchronisation to the run-in signal, a memory device responsive to the signals and controlled by the clock circuit, and means responsive to the arrival of a start code to route the following group of data for display purposes.

Bi-phase digital signals are especially attractive for broadcast transmission purposes. Each 1-bit is represented by a 1-level followed by a zero-level and each zero bit is represented by a zero-level followed by a 1-level or vice versa. It is a characteristic of the bi-phase signals that with any series of binary bits (each of which involves a transition even though it may be identical with the preceding bit) the maximum interval between the transitions can never be longer than the time occupied by one bit. Certain transmission errors are therefore recognisable as such.

In an advantageous arrangement, the apparatus for processing the data for transmission has its input connected with a source for the groups of data, said source being arranged to add address signals to information signals to provide said groups. The address signals are handled as parts of the groups and are best positioned before the information-defining characters.

The source for the groups of data advantageously incorporate a memory device for the information signals. According to an arrangement which is preferred because of its versatility, the memory device is a second storage device and there are provided a main storage device for data in digital form, means operable to read out portions of the data from the main storage device and temporarily store them in the second storage device and discharge means operable to discharge portions of the data at intervals from the second storage device, so that the data is output in the form of the series of groups.

By arranging the second storage device to store data in an amount which is large compared with the amount of data to be discharged on a single occasion, favourable flexibility of operation is obtained.

At least one peripheral generating device, for example, an alpha-numeric keyboard, may be arranged for supplying data to the main storage device. An arrangement which gives useful flexibility for editing purposes is to route the data to the main storage device via a rapid access memory which may be provided separately or may be a part of the second storage device.

The apparatus is conveniently applied to the transmission of a set of pages of information as aforesaid, in the form of a sequence of parts of the pages arranged such that the transmission of the set of pages is effected repeatedly, each said part of a page being transmitted in one of said groups of digital data.

Still further in accordance with the present invention, there is provided apparatus for the reception of signals of the kind aforesaid which comprises a clock circuit responsive for initial synchronisation to the run-in signal, a memory device responsive to the signals and controlled by the clock circuit, and means responsive to the arrival of a start code to route the following group of data for display purposes. After the clock circuit has been brought into synchronisation by the run-in signal, synchronisation tends to be maintained by the level transitions of the signals which follow.

The following description in which reference is made to the accompanying drawings is given in order to illustrate the invention. In the drawings.

The apparatus to be described provides or uses digital signals at a bit rate of 2.5 M bit per second. In each signal a run-in of 8 identical bits, which is sufficient to synchronise a receiver at a reasonable signal to noise ratio, is followed by a unique start code of 8 bits. Then follows a 5-bit line number, a page number of 6 bits, a strip number of 5 bits, a segment number of 3 bits and a set of 8 bits, all zero, which represent unused time or may be used for various commands for controlling the receiver. The last bit of this 8-bit set acts as a cleaning signal if it has a value of unity. This sequence is followed by ten 8-bit words each of which defines an alpha-numeric character. A maximum of 7 bits is required to define a character. Therefore, one of the 8 bits of the wording can be used for control purposes if desired. A blank is, of course, considered to be a character.

Thus, ten character codes are transmitted per signal. The intended display has 40 characters per strip. Each strip therefore requires four signals, correctly addressed. A complete page consists of 22 strips (88 segments) containing up to 880 characters. Using only a signal line of the field blanking period per field, conveniently line 16 in the 625 line system used in the United Kingdom, a page can be transmitted in about 1.5 seconds. A set of 50 pages can be transmitted repeatedly in a time of less than two minutes per complete cycle. This number of pages enables information on a usefully large number of topics (e.g. general and regional weather forecasts, stock market information, currency exchange rates, sports results and theatre information) to be made available to the viewer. The cycle time may be halved by using two lines (e.g. two adjacent lines) per field blanking period.

Figure 1:
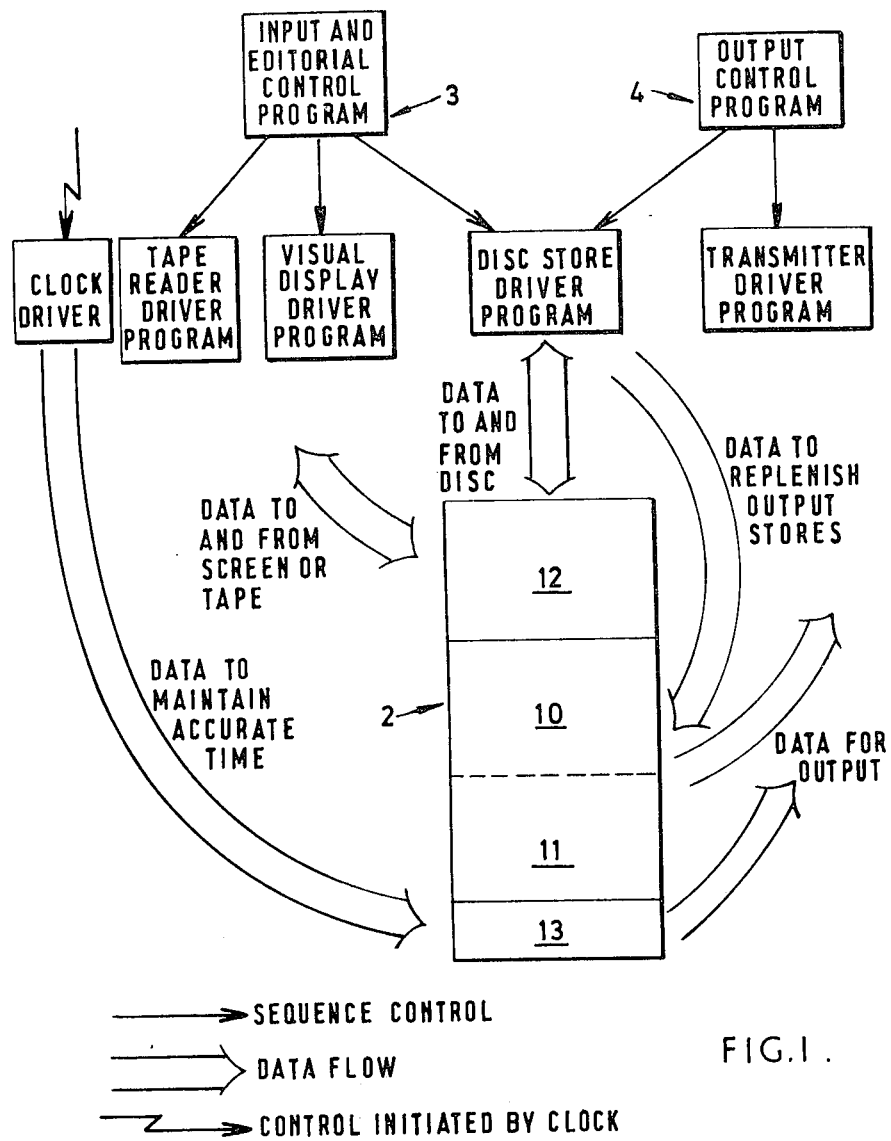
FIGS. 1 and 2 show a system for producing date signals with address codes.
Figure 2:
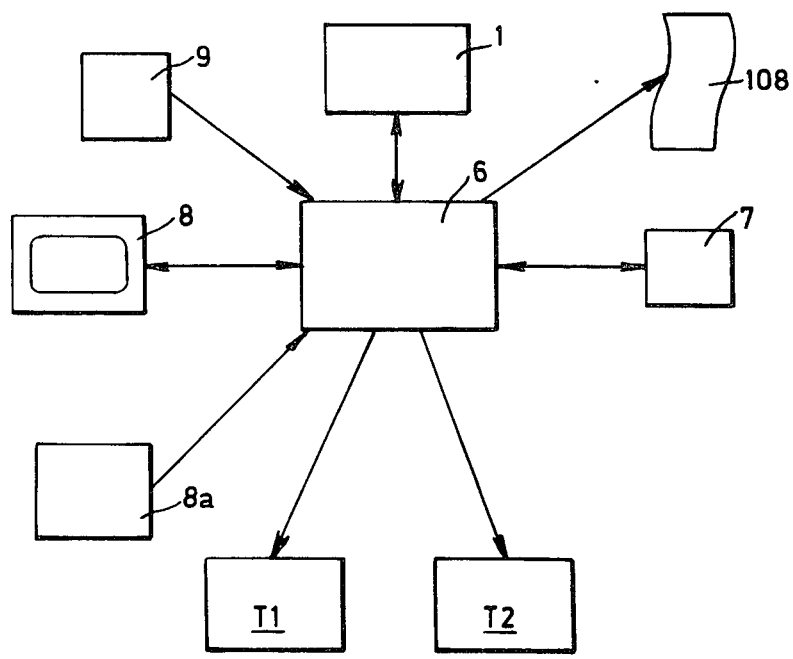

FIGS. 1 and 2 show the general arrangement of a signal generator system for producing output signals at intervals as required, these signals consisting of segments each of ten characters. A main storage device 1 (FIG. 2) in the form of a magnetic disc store is linked with a second storage device 2 (FIG. 1) of the rapid access core store type. An input and editorial subsystem 3', an output subsystem 4 and a clock input 5' are provided as shown generally. The program control, data flow and the control initiated by the computer clock are as shown — see the KEY which forms part of FIG. 1.

The storage device 2 actually part of a Honeywell DDP516 computer which is programed by soft-ware to simulate the input and editorial subsystem 3' and the output subsystem 4. Other commercially available computers may, of course, be employed. The configuration of the hardware is shown in FIG. 2, and the form of the soft-ware is shown in FIG. 1. In FIG. 2, the central processor and memory 6 is constituted by the programed computer of FIG. 1. Linked thereto are the disc store 1, a tape reader 7 for feeding in characters from punched tape, a keyboard 8a for feeding in characters direct, a visual display unit 8 for displaying a page of data when required, a printer 108 for producing a printed record, a digital clock 9 and data transmitters, shown as $T_1$ and $T_2$, respectively, for two adjacent lines of a field.

The output subsystem 4 recalls pages of data from the disc store 1 and each page, after being sub-divided into segments, is output one segment at a time. One segment is output on receipt of each interrupt which signals a requirement for data for transmission. The system shown uses two television lines per field, but the software is so designed as to require only a simple modification to allow an extension to more lines per field, without affecting the overall design philosophy. A reduction to a lower number of lines per field requires no software inserter for that line. The system will then continue to output on the remaining lines without loss of data but with an appropriate increase in the time taken to output a page. The system will recommence output on a line when the inserter for that line is switched on again.

The output subsystem 4 is effectively divided to provide two principal functions; one for outputting data for transmission and one for retrieving from the main storage system the next page to be output. Although these functions are not completely independent they are arranged so that a queue of pages ready for output can always be maintained while another page is already being output. This is done so that no time is lost between output of pages, as might happen if pages were not called from the storage device until they were needed for output. At present only one page is kept in this way in addition to the one being output although the principle, which involves realtime interrupts, can easily be extended to maintain a larger queue should it ever be required. The second storage is divided into as many page-size areas as is necessary to contain the queue plus the page currently being transmitted (10 and 11 in FIG. 1 for queue of 1).

In addition to the normal page text, a 24 hour digital clock is displayed on each page giving a reading in hours, minutes, and seconds. The time is read from a clock and written directly into a section 13 of the storage device 2, by a program which arranges for the output of a segment containing the current time. The segment is addressed so that the receiving equipment will display it whatever page has been selected. Thus the time need only be output once for all pages, and since it is output at least once every second, the effect at the receiver is that of an accurate continually changing digital clock.

Subtitling captions can be arranged to be transmitted on the system. In conjunction with special editorial equipment (and possibly personnel) these captions could be provided as say two rows of characters at the bottom of the screen as a commentary for deaf viewers, and/or minority language audiences. Such captions may be transmitted frequently and interspersed between the other pages of data.

The editorial sub-system 3' gives access to the pages of data by means of commands input on a typewriter-like keyboard. Various commands are available to an operator who wishes to exert some control over the system by means of editing existing pages or inserting new pages of text into the system.

For editing purposes, a page of text can be taken from the disc store, stored in a section 12 of the storage device 2 and read out for display on the visual display unit, and can then be edited by inserting, removing or replacing characters using the keyboard, and can then be written back into the section 12 of the second store.

New pages can be typed onto the screen using keyboard 8a and then inserted into the system to completely replace an existing page or to fill an empty page. Redundant pages can also be erased in this way. Text can also be prepared on punched paper tape and read into the system through a paper tape reader 7.

The commands available also allow elementary control of the output sub-system in that an operator at the keyboard can cause the output to be started, stopped or channelled to a printing device, thus producing a hard copy of all the pages in the system for administrative purposes. The ability to switch the output subsystem on or off while still running the editorial subsystem means that text can be edited either outside or within the hours during which it is transmitted.

Without altering the physical structure of the system, other commands may be added to give greater flexibility in the editing of pages to facilitate, for example, the exchange of the contents of two or more pages, or a page rolling facility for types of pages where latest information is more important than earlier information.

In addition extra input devices enabling the input or editing of graphical displays may be incorporated. Graphical displays of limited detail may be built up of characters designed for the purpose.

To reduce the likelihood of text, having been edited on the display screen, being then written back onto the wrong page, thus overwriting a wanted page, by the editor accidentally typing the wrong number, elementary integrity procedures are used. These do, of course, allow him to write text to a different page if that is what he wants to do.

If a page is only partly filled, arrangements may be made so that, instead of reading-out the parts of the page consisting only of blanks from the storage device 2, only segments containing non-space characters are read out; blank segments are not transmitted. Reading-out the next page will thus begin early in response to an appropriate instruction. The cycle time for the complete set of pages is accordingly reduced. Owing to the address code being attached to each segment, the received display is not affected by this transmission economy.

Figure 3:
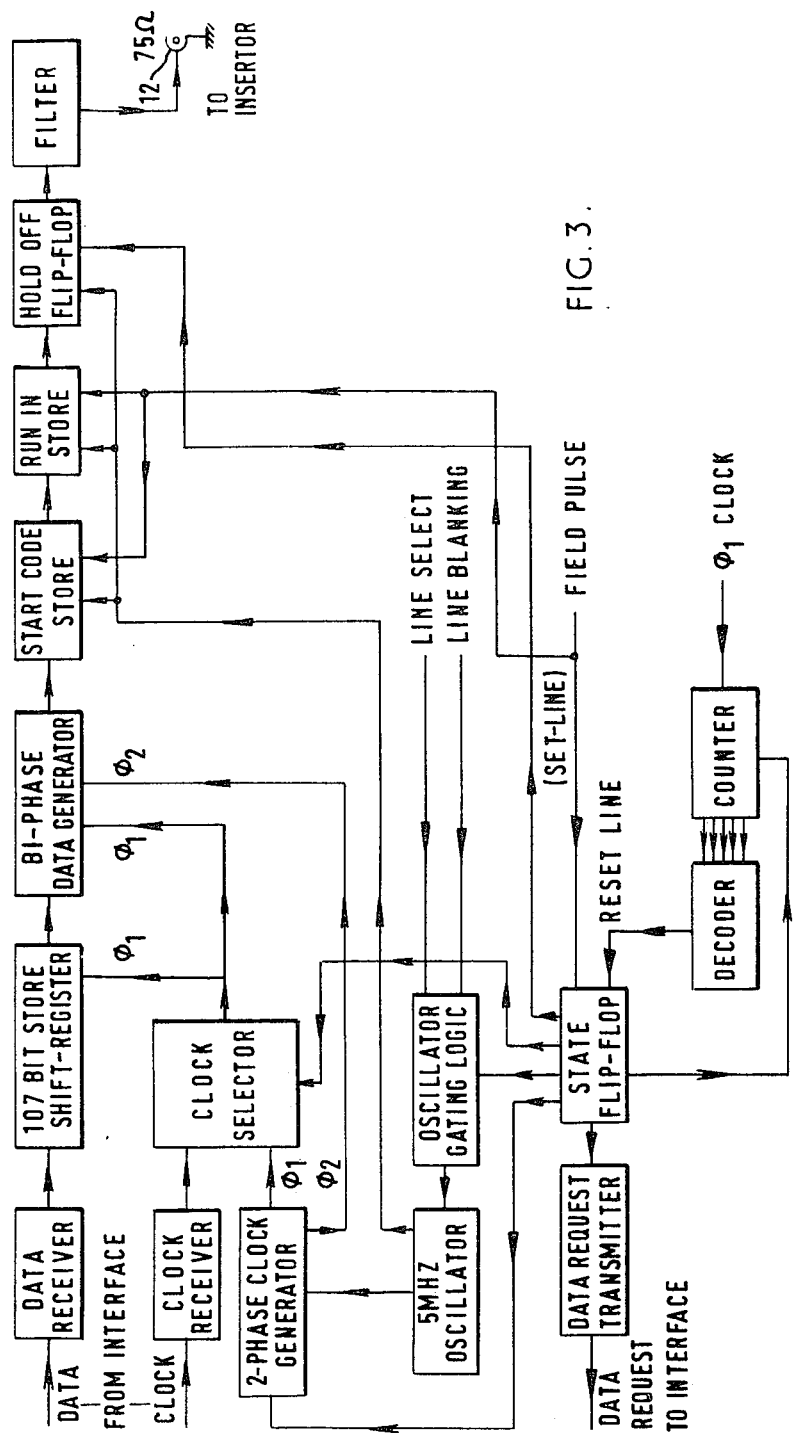
FIG. 3 shows a transmission circuit for processing the signals produced by the system of FIG. 1 prior to distribution.

The output from the apparatus of FIGS. 1 and 2 is fed via an interface to the transmission circuit of FIG. 3 which provides an output on a 75 ohm cable 12 for an inserter by which the output is inserted in the field blanking intervals of the required line or lines of a television signal to be distributed by radiation or otherwise. Line select pulses are provided by the inserter. The interface and the transmission circuit both have data storage capacity. Together with the data storage capacity of the second storage device 2 they give the system as a whole ample storage capacity to compensate for lack of synchronisation of its parts. A system depending upon the immediate availability to a television transmitter of data from the second storage device 2 (and especially if the device 2 were arranged to hold only one page of data) would be unreliable under actual service conditions.

The operation of the transmission circuit of FIG. 3 is as follows:

A field pulse derived in a sync separator responsive to the television signal sets the STATE FLIP-FLOP into the transmit state and loads the START CODE and RUN IN into the store (i.e. shift register). The transmit state of the STATE FLIP-FLOP primes the OSCILLATOR GATING LOGIC, instructs the CLOCK SELECTOR to select the $\phi_1$ CLOCK and takes the clear off the 2PHASE CLOCK GENERATOR, BIT COUNTER and HOLD OFF FLIP-FLOP.

The circuit then waits until it receives a line select and a line blanking pulse derived in the insertor and sync separator respectively. The parts of the two pulses which coincide with each other (i.e. the length of the line blanking pulse) enables the 5 MHz OSCILLATOR via the OSCILLATOR GATING LOGIC.

The $\phi_1$ CLOCK PULSES are counted in the COUNTER and after 124 $\phi_1$ CLOCK pulses have occurred (i.e. all the data has been shifted out) a RESET PULSE is produced by the DECODER to reset the STATE FLIP-FLOP into its DATA RECEIVE STATE. The transition from TRANSMIT to RECEIVE STATE is transmitted to the INTERFACE as a request for new data.

The DATA RECEIVE STATE also applies a RESET to the COUNTER, 2-PHASE CLOCK GENERATOR and HOLD OFF FLIP-FLOP and instructs the CLOCK SELECTOR to select the external clock (i.e. clock supplied by the interface to the data transmitter).

The interface replies to the request with the transmission of new data. This data is clocked into the 107 BIT STORE SHIFT REGISTER by the clock supplied by the interface via the CLOCK RECEIVER and CLOCK SELECTOR.

The circuit then awaits a new field pulse to repeat the cycle as described before.

Figure 4:
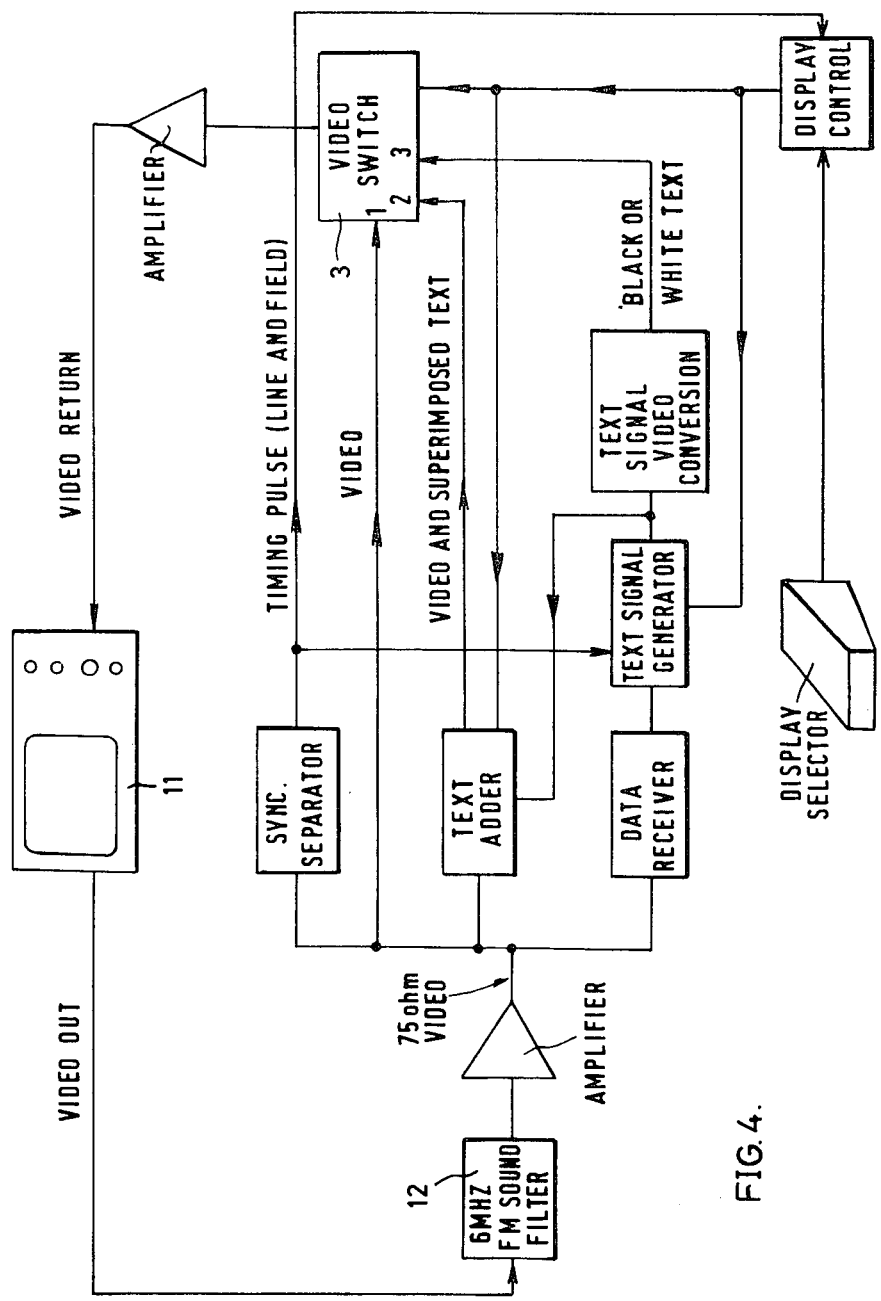
FIG. 4 is a block diagram showing a normal television receiver modified by the addition of a system as provided by the invention.

Referring to FIG. 4, the demodulated television signal to which the television receiver is tuned is taken from the receiver 11 at an emitter follower point. The signal contains 6 MHz F/M sound which is filtered by filter 12. The signal is then amplified to provide several feeds of 75 ohm video.

The sync separator derives, from the incoming demodulated signal, line and field rate timing pulses which are used in various parts of the system.

One video feed goes direct to part 3 which for simplicity may be regarded as a video switch.

A second video feed to the video switch goes via a text adder. The text adder adds a controlled amount of current to this video signal so that captions are effectively superimposed on the picture corresponding to this video path.

A third video feed passes to the data receiver. The data receiver is exposed to the whole video signal, and can pick out the data signal, discriminating against normal picture signals. Alternatively, the data receiver might be enabled only during the appropriate times when the data lines occur in the signal.

The data receiver presents the data to the stores of the Text Signal Generator. This generates the appropriate text signal at logical (Transistor-Transistor Logic) voltage levels.

The text signal is used to control the text adder and is also passed via a filter and a converter which changes the signal to 75 Ohm video level. This video text signal then passes to another input of the video switch.

The output of the video switch is either input 1, 2 or 3 in the diagram. This passes through an amplifier and returns the signal to the luminance channel of the set (at approximately 5 volts peak to peak in this case).

Control of the display is effected by pressing the appropriate button on the display selector. Possibilities are as follows:-

| Button | Video Switch Output |
| --- | --- |
| Picture only | Input 1 |
| Picture + text (added) | Input 2 |
| Picture + text (non additive) | Input 1 and 2 (whichever is instantaneously greater) simultaneously |
| Text only (black or white text) | Input 3. |

The display control ensures that correct timing is maintained as follows.

Text is only produced during active line time (not during line sync pulses).

Text is not produced during field blanking. The video switch always passes the input 1 to the output during line and field sync times. This ensures that the output always contains the correct television synchronising pulses.

Black text or white text is effected by either using normal or inverted polarity text signal under control from the display selector and display control. The display selector also contains a connection to the set which enables the sound output of the set to be muted.

In an alternative arrangement, instead of taking a demodulated signal from the television receiver, an adapter is connected in the aerial lead. In this case the input to the system is at R.F. This is demodulated to video and a similar process performed on the video signal as just described. The resultant video is then remodulated and passed to the aerial input of the television receiver on an appropriate channel.

If data from one television channel is to be displayed over another television channel, then a second R.F. demodulator is required, one to provide the data, the other for the normal television programme.

The system of FIG. 4 may be modified to include coloured captions. In this case direct access to the Red, Green, Blue guns of the television receiver is the simplest solution. An R.F. aerial lead adaptor would also be possible.

Figure 5:
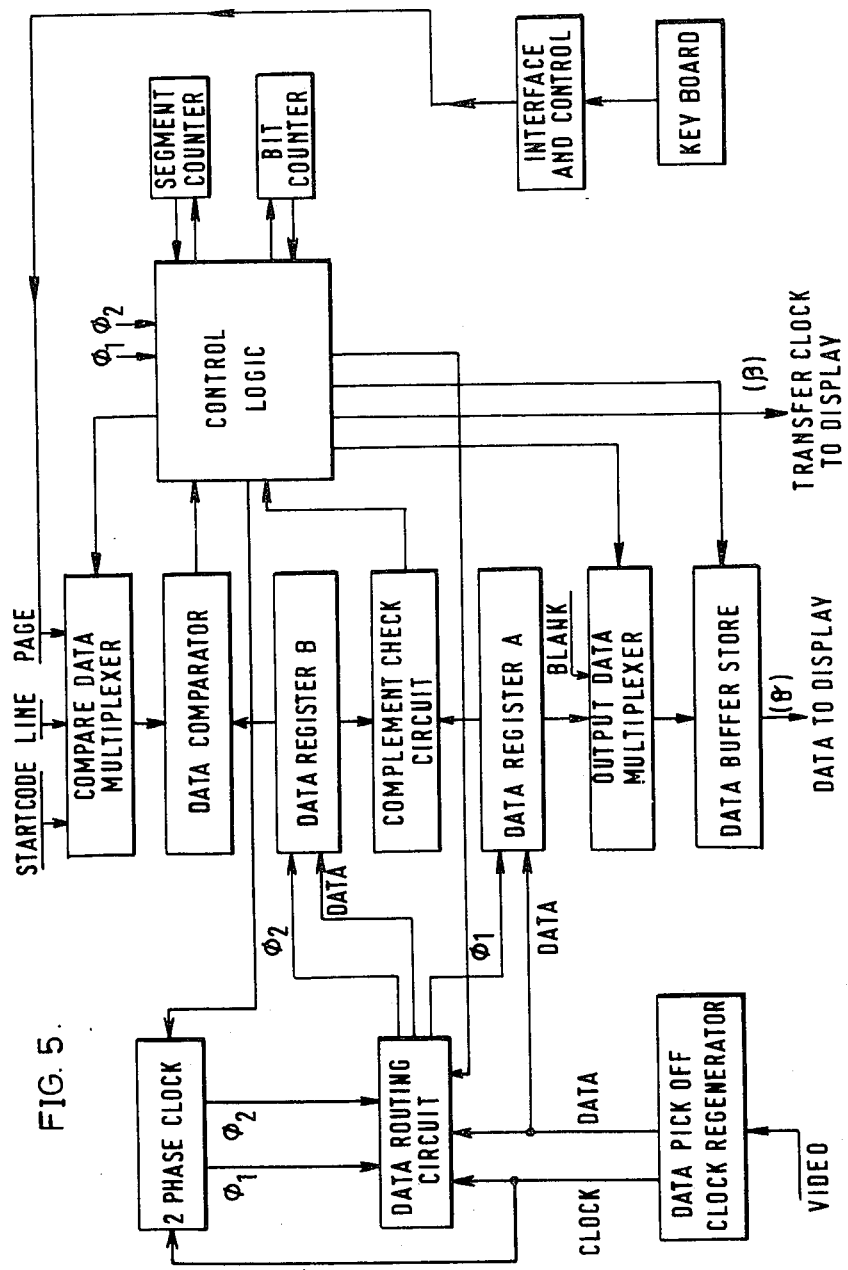
FIGS. 5 and 6 are block diagrams showing parts of the system shown in FIG. 1 in further detail.
Figure 7:
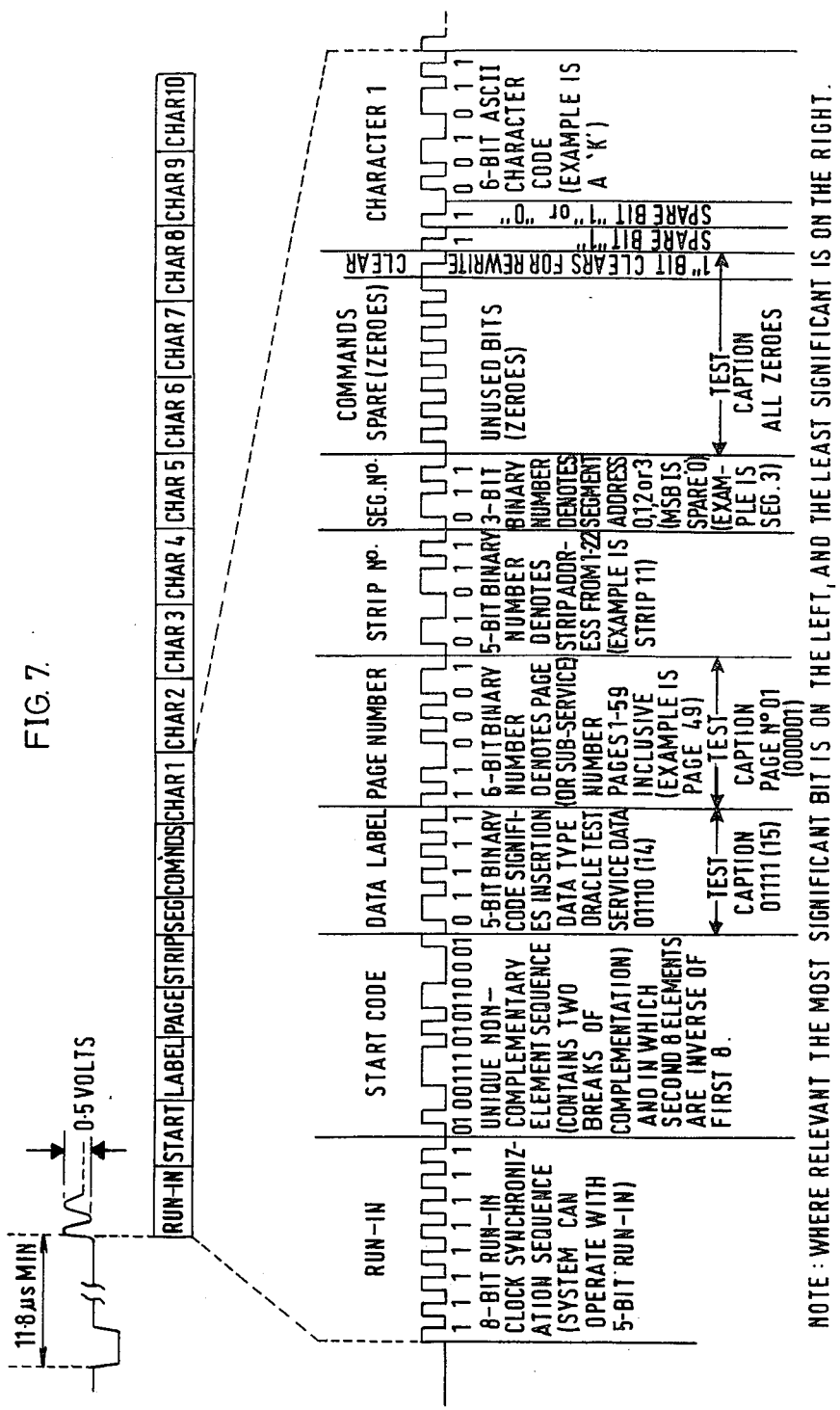
FIG. 7 is a diagram illustrating the form of the data handled.

The part marked "Data Receiver" in FIG. 4 is shown in detail in FIG. 5. As shown in FIG. 7, the data format consists of 16 parts of varying length excluding the run in. After the start code the signal is in the form of bi-phase bits and the character signals are in a standard ASCII code.

Referring now to FIG. 5, the DATA PICK OFF and CLOCK REGENERATOR presents the DATA ROUTING CIRCUIT with the data and regenerated clock at standard TTL logic levels.

Until a start code has been received the DATA REGISTERS A and B are connected in series via the DATA ROUTING CIRCUIT and data is continuously shifted through the DATA REGISTERS. The receiver recognises a start code by continuously comparing the contents of DATA REGISTER B with the start code applied to the DATA COMPARATOR via the COMPARE DATA MULTIPLEXER. The contents of DATA REGISTERS A and B are also compared in the COMPLEMENT CHECK CIRCUIT to see if the halves of the start code complement each other. When a correct start code has been received the CONTROL LOGIC will store this and increment the DECODE COUNTER (not shown, but included in the CONTROL LOGIC) by 1 which now points to the part of the data containing the line number.

The CONTROL LOGIC instructs the COMPARE DATA MULTIPLEXER to apply the selected line number to the COMPARATOR and connects the DATA REGISTERS A and B in parallel via the DATA ROUTING CIRCUIT. A TWO PHASE CLOCK is applied to the DATA REGISTERS clocking REGISTER A first and then B. As a BI-PHASE transmission mode is used, the first element of each bit is shifted into DATA REGISTER A and the second element into B. Therefore DATA REGISTER B will contain the inverse data of DATA REGISTER A.

After the correct start code has been received and the next 5 bits have been demultiplexed by the two phase clock action and shifted into DATA REGISTERS A and B a strobe pulse is generated by the BIT COUNTER to compare the received data with the selected data label and to check if the contents of DATA REGISTERS A and B complement each other. If so, this again is stored in the CONTROL LOGIC which in turn will increment the DECODE COUNTER by 1, pointing now to the part of the data containing the page number.

A further 6 bits are demultiplexed and shifted into the DATA REGISTERS A and B. A strobe pulse is again generated by the BIT COUNTER to compare the received data with the selected page number and to check if the contents of the two REGISTERS A and B complement each other. This again is stored in the CONTROL LOGIC which increments the DECODE COUNTER by 1, pointing now to the part of the data containing the strip and segment numbers.

If the correct start code and selected line and page number have been received the control logic will pass the next 13 parts of the data (96 bits in 12 8-bit groups) on to the DISPLAY via the OUTPUT DATA MULTIPLEXER and DATA BUFFER STORE. If at any time a complementation error is found within an 8-bit group, a blank is passed on to the DISPLAY instead of the received data within that group. After the 13 parts have been passed on to the DISPLAY the control unit will reset, ready to receive another start code and new data and the cycle is repeated.

Figure 6:
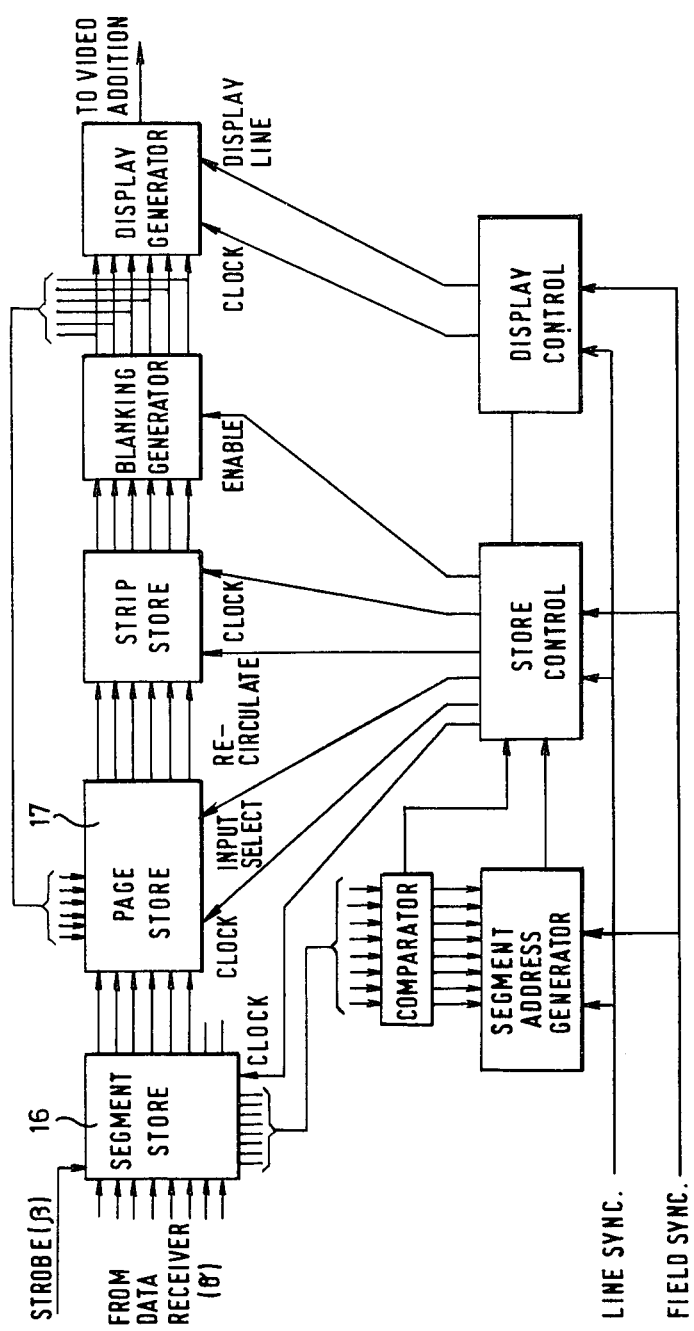

FIG. 6 shows further details of the part marked "Text Signal Generator" in FIG. 4. Data is received in the form of eight-bit parallel words on an eight wire input from the data received from the apparatus of FIG. 2. These words are presented to the input of a segment store 16, consisting of eight 16-bit serial-in parallel-out shift registers. When each word is presented to the input of the store 16, a strobe pulse is applied thus entering the data. Twelve words are clocked into the store, the first of which denotes the row and segment address. If transmission is on two lines per field, two similar segment stores are required, one for each data line received in the field blanking time.

The page store 17 into which the incoming data is clocked at the appropriate time consists of six 1024-bit shift registers. This page store then feeds into a strip store which consists of six 40-bit shift registers. The output of the strip store addresses a character generator via a blanking generator.

In order to print a character on the television screen the predetermined code for that character must be presented to the display generator at the appropriate times on the appropriate lines of the field scan. Since a character generator of the 7 × 5 matrix type is used, this predetermined character code must be presented to the display generator seven times whilst the row number is stepped from 1 through 7. In order to display a strip of 40 characters on the screen the strip store must be rotated 7 times (once per scan line) whilst the row number is stepped from 1 through 7.

For the display of a full page of information the page store must be rotated fully once per picture field, but only in steps of 40 characters corresponding to the last rotation of the strip store.

In fact that strip store is only actually rotated 6 times and on the seventh row the output of the strip store is entered into the front of the page store. Twenty two strips of characters are generated on the screen and each of these consists of four segments.

As the strip store is rotated the seventh time, segment addresses 0 through 3 are generated internally and are compared with the input segment number which appears at the twelfth position in the line store.

Immediately after each seventh rotation of the strip store, a strip number counter is incremented by one step through the range 1 to 22 and this is compared with the input strip address. When strip and segment address of input data and currently displayed data are the same, the page store is switched to accept data from the segment store 16. As soon as the local segment address is incremented the page store switches back to accepting data from the strip store.

When a page of data is initially selected one full rotation of the page store is completed with the blanking generator switched on, thus emptying the store of the previous information. The receiver will display a blank screen until such a time that it receives appropriate new data from the text signal generator.

The extreme left- and right-hand segments of strip 1 of all pages may possess a transparent page number of such character that they are displayed whichever page is selected. The left-hand segment may contain the page number actually being transmitted at the particular time, and the right-hand segment may contain the time of day accurate to one second.

It will be understood that the detailed description of specific apparatus given herein are provided by way of illustration only, and that various departures from that apparatus may be made without departing from the ambit of the invention.

We claim:

1. Apparatus for processing groups of binary digital information, each group consisting of a series of binary digits for transmission, which apparatus comprises a bi-phase generator for converting the digits of the groups to a bi-phase digital form in which each digit is represented by a transition from a first signal level to a second signal level and the digits of the group are accordingly all represented by signals of the first level complemented by signals of the second level, a start code generator operable to provide repeatedly a binary digital start code of said bi-phase digital form but with a break of said complementation, a run-in signal generator operable to provide a run-in signal and means for feeding trains of output signals to an output from the apparatus at spaced-apart intervals of time each train of output signals having a run-in signal from the run-in signal generator followed by a start code, from said start code generator, with said break of complementation and then by one of said groups in said bi-phase digital form.

* * * * *